United States Patent [19]
Reyes

[11] Patent Number: 5,921,525
[45] Date of Patent: Jul. 13, 1999

[54] ELECTRONIC DEVICE ASSEMBLY FIXTURE

[75] Inventor: Theodore R. Reyes, Escondido, Calif.

[73] Assignee: Qualcomm Incorporated, San Diego, Calif.

[21] Appl. No.: 08/976,870

[22] Filed: Nov. 24, 1997

[51] Int. Cl.$^6$ .................................................. F16M 3/00
[52] U.S. Cl. .............................. 248/676; 269/37; 269/41
[58] Field of Search .................................. 248/678, 676, 248/637, 544, 121, 346.03, 694; 269/37, 41; 40/124.4, 763, 764

[56] References Cited

U.S. PATENT DOCUMENTS 5,388,813  2/1995  Arsenault .................................. 269/41

Primary Examiner—Ramon O. Ramirez
Attorney, Agent, or Firm—Russell B. Miller; Christopher O. Edwards; Sean English

[57] ABSTRACT

An L-shaped assembly fixture is used in connecting cables between components in a housing and a top panel for closing the housing after assembly. A base plate of the fixture has opposite side edges and opposite end edges, and an upright plate is secured along one side edge of the base plate so as to project upwardly in a direction perpendicular to the base plate. The upright plate has an upper edge with a slot extending along the length of the upper edge for supporting a top panel vertically adjacent an open face of a housing which is supported on the base plate.

10 Claims, 1 Drawing Sheet

ELECTRONIC DEVICE ASSEMBLY FIXTURE

BACKGROUND OF THE INVENTION

The present invention relates generally to assembly fixtures for use in the electronics industry and is particularly concerned with an assembly fixture for use in assembling an electronics module such as a PCS driver module, amplifier, or the like which has a base and a lid or top panel forming a housing for various electronic components.

Electronics modules such as PCS driver modules typically have an open-faced container or box and a lid or top panel for closing the open face once assembly is complete. Typically, interconnect cables must extend from the undersurface of the lid or top panel to connect to components or circuitry within the container. Once the necessary components have been installed and the cable interconnections made, the top panel is fastened over the open face of the container to finish the module assembly.

One problem in such an assembly is that the top panel or lid cannot easily be held in a suitable position for making the cable connections, since assembly personnel will need two hands to connect the cables.

SUMMARY OF THE INVENTION

It is an object of the present invention to provide a new and improved assembly fixture for assembly of electronics equipment modules such as PCS driver modules.

According to the present invention, an assembly fixture is provided which comprises a rectangular base plate having opposite side edges and opposite end edges, and an upright plate secured along one side edge of the base plate so as to project upwardly in a direction perpendicular to the base plate, the upright plate having an upper edge with a slot extending along the length of the upper edge.

The base plate is of suitable shape and dimensions for supporting the base or housing of an electronic equipment module with the open face of the housing facing upwardly, while the slot in the upper edge of the upright plate is of suitable dimensions for receiving one edge of the module lid or top panel so as to support the lid or top panel in an upright orientation adjacent the open face of the housing or base. The fixture is of any suitable rigid material such as metal, and the upright plate may be secured to the base plate via any suitable fasteners, such as a series of spaced screws. The overall fixture is generally L-shaped and the height of the upright above the base is preferably substantially equal to the module height, so that the open upper face of the housing or module base will be more or less level with the upper edge of the upright plate.

Any electronic module containing equipment may be readily assembled using this fixture. The housing is simply placed horizontally on the base plate, and the lid or top panel is seated in the slot on the upright plate adjacent the open face of the housing. Interconnect leads can then be connected between components or circuitry within the box and the inner surface of the top panel. The positioning of the top panel in an upright orientation adjacent the open face of the box or housing is much more convenient for making such connections, and does not require someone to physically hold the panel upright while completing the assembly. Once the interconnections have all been made, the top panel or lid is then set into the open face and fastened down, completing the assembly.

BRIEF DESCRIPTION OF THE DRAWINGS

The present invention will be better understood from the following description of a preferred embodiment of the invention, taken in conjunction with the accompanying drawings, in which like reference numerals refer to like parts, and in which.

DESCRIPTION OF THE PREFERRED EMBODIMENT

Figure 1:
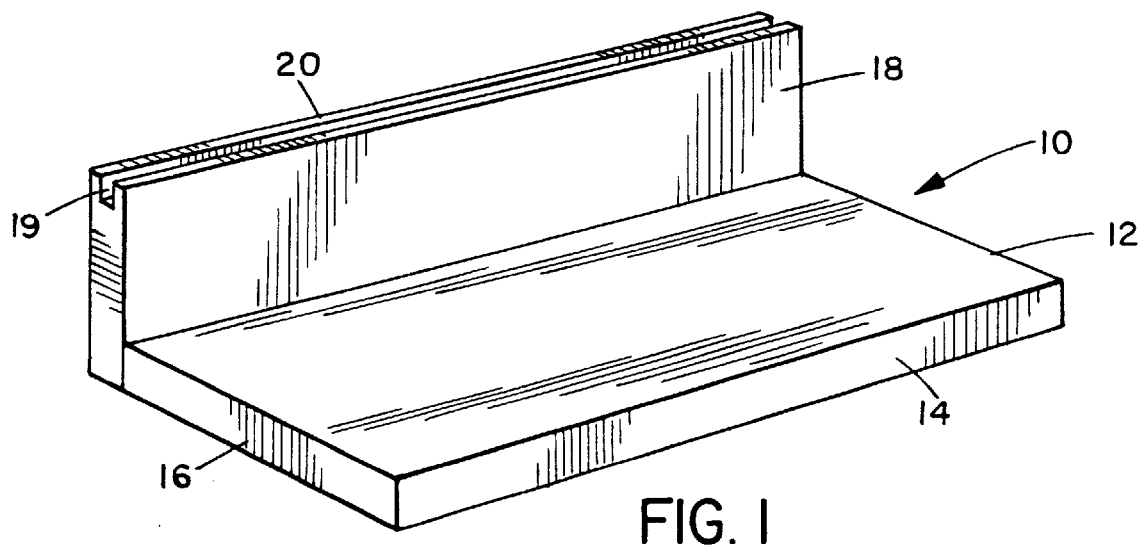
FIG. 1 is a perspective view of the assembly fixture according to a preferred embodiment of the invention.
Figure 2:
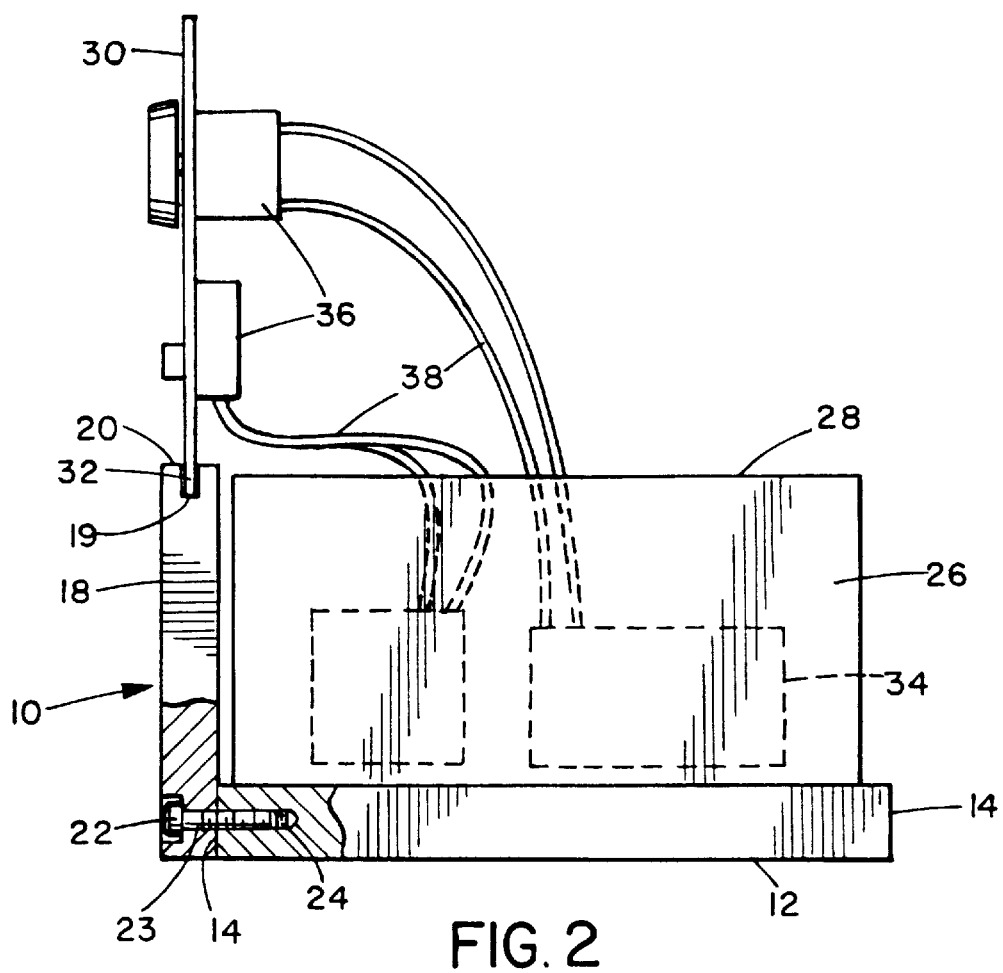
FIG. 2 is a side elevation view, partially cut away, showing components mounted on the fixture to facilitate assembly.

FIGS. 1 and 2 illustrate an assembly fixture 10 for use in assembly of electronic equipment modules, such as PCS driver modules and the like. The fixture 10 basically comprises a rectangular base plate 12 having opposite side edges 14 and end edges 16, and an upright plate 18 secured along one side edge 14 of the base plate so as to project upwardly in a direction perpendicular to the base plate, forming a generally L-shaped configuration. An elongate slot 19 extends along the entire upper edge 20 of the upright plate 14.

The upright plate 18 is secured to the base plate by any suitable fastener devices. In the illustrated embodiment, spaced screws 22 secure the plates together. Each screw 22 extends through a respective bore 23 adjacent the lower edge of the base plate and into an aligned, threaded bore 24 extending transversely into the side edge 14 of the base plate, as best illustrated in FIG. 2. Preferably, a series of four spaced screws is provided.

The method of using the fixture to assemble an electronics module is schematically illustrated in FIG. 2. A box-like housing or container 26 having an open upper end 28 is seated on the base plate 12 so that upper end 28 is adjacent the upper edge 20 of the upright plate or panel 14. A face panel or lid 30 for the housing has one side edge 32 seated in the slot 19 so that the panel is supported upright adjacent one side of the open upper end of the housing. Typically, electronic components 34 and circuitry will be mounted within the housing and some components 36 such as indicator lights and controllers will be mounted on the panel 30. While the housing and panel are supported on the fixture as in FIG. 2, interconnect cables 38 may be readily connected between respective components 34 within the container or housing and components 36 on the lid.

Once all the necessary interconnections have been made, the top panel 30 is simply lifted out of the slot and set into the open upper end of the housing. The panel 30 is then fastened to the housing in the conventional manner. The assembly fixture of this invention therefore considerably simplifies assembly of electronic component modules.

The dimensions of the fixture 10 will be selected according to the dimensions of the module to be assembled. The base plate 12 will be of shape and dimensions slightly larger than the base dimensions of the module housing 26, while the height of upright plate 18 above the upper face of the base plate will be substantially equal to the height of the housing 26. In one specific example of a PCS driver assembly fixture, the base plate had a width of 7.5", a length of 15.75", and a thickness of 0.75". The upright plate had a height of 4" and a thickness of 0.5". These dimensions may be varied based on the dimensions of the module to be assembled. The assembly fixture or tool 10 is of any sufficiently rigid metal or material, such as aluminum.

The dimensions of slot 19 will be sufficient to form an adequate seat for the respective edge of the panel 30, so that the panel is supported in an upright configuration. In one particular example, the slot had a depth of around 0.5" and a width of around 0.08", although other dimensions may be used for face panels of differing thickness and transverse dimensions. The slot width is substantially equal to, or slightly greater than, the panel thickness.

The assembly fixture will support a base housing of an electronics module in a horizontal orientation adjacent the top panel which is supported in a vertical orientation at an appropriate position for connection cables between the top panel and housing. This makes assembly much faster, easier and more convenient than in the past, where the top panel had to be supported manually while connections were made.

Although a preferred embodiment of the invention is described above by way of example only, it will be understood by those skilled in the field that modifications may be made to the disclosed embodiment without departing from the scope of the invention, which is defined by the appended claims.

I claim:

1. An assembly fixture for assembly of a module having a base housing containing electronic components and a top panel closing the housing, the fixture comprising:

a base plate having opposite side edges and opposite end edges; an upright plate having an upper edge and secured along one side edge of the plate so as to project upwardly in a direction perpendicular to the base plate, whereby the fixture is of substantially L-shaped cross-section; and a slot extending along the length of the upper edge and formed within the thickness of the plate for supporting the panel adjacent an open end of the housing seated on the base plate.

2. The fixture as claimed in claim 1, wherein the base plate is rectangular and the side edges are longer than the end edges, the upright plate having a length equal to the length of the base plate.

3. The fixture as claimed in claim 1, wherein the base plate and upright plate are each of predetermined length.

4. The fixture as set forth in claim 3, wherein said predetermined length is approximately equal to the length of the module to be assembled on the fixture.

5. The fixture as claimed in claim 1, wherein the slot has a depth of at least 0.5 inches.

6. The fixture as claimed in claim 1, wherein the upright plate has a lower edge portion adjacent the side edge of the base plate, and a plurality of spaced fasteners project through the lower edge portion of the upright plate into the side edge of the base plate to secure the upright and base plates together in an L-shaped configuration.

7. The fixture as claimed in claim 1, wherein the base plate has an upper, substantially flat face for supporting a housing having an open top, and the upright plate has a predetermined height above the upper face substantially equal to the height of the housing.

8. The fixture as claimed in claim 1, where the slot is of predetermined width.

9. The fixture as set forth in claim 8, wherein said predetermined width is at least equal to the thickness of the panel to be supported.

10. A method of connecting components in an outer housing to a top panel for closing the housing prior to attachment of the top panel to the housing, comprising the steps of:

placing a housing containing electronic components on a base plate of an L-shaped assembly fixture in a horizontal orientation with an open top of the housing facing upwardly;

placing an edge of a top panel for closing the housing in an upwardly facing slot on an upper edge of an upright plate of the L-shaped fixture adjacent the open upper end of the housing, so that the top panel is supported in a vertical orientation;

connecting cables between components in the housing and an inner face of the top panel according to predetermined assembly requirements;

removing the panel from the slot when all necessary connections have been made and placing the panel over the open face of the housing; and securing the panel to the housing.

* * * * *